United States Patent
Yasuda et al.

(10) Patent No.: US 8,571,361 B2
(45) Date of Patent: Oct. 29, 2013

(54) COMBINED OPTICAL AND ELECTRICAL FLEXIBLE WIRING AND PRODUCTION METHOD THEREFOR

(75) Inventors: Hiroki Yasuda, Mito (JP); Kouki Hirano, Hitachinaka (JP); Takami Ushiwata, Hitachi (JP); Masanobu Ito, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 239 days.

(21) Appl. No.: 13/044,900

(22) Filed: Mar. 10, 2011

(65) Prior Publication Data
US 2011/0293226 A1    Dec. 1, 2011

(30) Foreign Application Priority Data
May 27, 2010  (JP) ................. 2010-121682

(51) Int. Cl.
G02B 6/12 (2006.01)
G02B 6/42 (2006.01)
G02B 6/26 (2006.01)
H01B 11/22 (2006.01)
H01R 43/00 (2006.01)
H05K 1/00 (2006.01)
B32B 38/04 (2006.01)

(52) U.S. Cl.
USPC ............... 385/14; 385/51; 385/52; 385/91; 385/101; 29/825; 264/1.25; 361/749; 156/250

(58) Field of Classification Search
USPC .............. 385/14, 51–53, 88–92, 101, 129; 29/825; 361/748–749, 760; 264/1.24–1.25; 156/250; 174/70
See application file for complete search history.

(56) References Cited

FOREIGN PATENT DOCUMENTS

JP   A-2008-158539   7/2008
JP   A-2010-019895   1/2010

*Primary Examiner* — Uyen Chau N Le
*Assistant Examiner* — Michael Mooney
(74) *Attorney, Agent, or Firm* — Scully, Scott, Murphy & Presser, P.C.

(57) ABSTRACT

A combined optical and electrical flexible wiring includes a first film substrate, a plurality of conductors aligned parallel on a surface of the first film substrate, an optical fiber provided on the surface of the first film substrate and aligned parallel to the plural conductors, a second film substrate with which the plural conductors and the optical fiber are covered in such a manner as to include an exposed portion, a resin mount provided over the exposed portion in such a manner as to cover the plural conductors and the optical fiber, the resin mount being formed with a light inlet or outlet groove including a mirror surface therein, an optical-electrical conversion component formed on a surface of the resin mount, and a wiring pattern formed on the surface of the resin mount.

12 Claims, 13 Drawing Sheets

2a FIRST FILM SUBSTRATE
2b SECOND FILM SUBSTRATE
3 CONDUCTOR
4 OPTICAL FIBER
5 OPTICAL-ELECTRICAL CONVERSION COMPONENT
8 RESIN MOUNT
9 OUTLET GROOVE
10 MIRROR SURFACE
11 WIRING PATTERN
20 EXPOSED PORTION

2a FIRST FILM SUBSTRATE
2b SECOND FILM SUBSTRATE
3 CONDUCTOR
4 OPTICAL FIBER
5 OPTICAL-ELECTRICAL CONVERSION COMPONENT
8 RESIN MOUNT
9 OUTLET GROOVE
10 MIRROR SURFACE
11 WIRING PATTERN
20 EXPOSED PORTION

| |
|---|
| 2a FIRST FILM SUBSTRATE |
| 2b SECOND FILM SUBSTRATE |
| 3 CONDUCTOR |
| 4 OPTICAL FIBER |
| 6 REINFORCING PLATE |
| 7 CARD EDGE CONNECTOR |

2a FIRST FILM SUBSTRATE
2b SECOND FILM SUBSTRATE
3 CONDUCTOR
4 OPTICAL FIBER
8 RESIN MOUNT
20 EXPOSED PORTION

2a FIRST FILM SUBSTRATE
2b SECOND FILM SUBSTRATE
3 CONDUCTOR
4 OPTICAL FIBER
8 RESIN MOUNT
9 OUTLET GROOVE

| 2a FIRST FILM SUBSTRATE |
| 2b SECOND FILM SUBSTRATE |
| 3 CONDUCTOR |
| 4 OPTICAL FIBER |
| 8 RESIN MOUNT |
| 9 OUTLET GROOVE |
| 10 MIRROR SURFACE |
| 11 WIRING PATTERN |
| 13 GROUND WIRING |

COMBINED OPTICAL AND ELECTRICAL FLEXIBLE WIRING AND PRODUCTION METHOD THEREFOR

The present application is based on Japanese patent application No. 2010-121682 filed on May 27, 2010, the entire contents of which are incorporated herein by reference.

BACKGROUND OF THE INVENTION

1. Field of the Invention

This invention relates to a combined optical and electrical flexible wiring mounted with an optical fiber and an optical-electrical conversion component (herein also including an electrical-optical conversion component) on a flexible flat cable, and a production method therefor.

2. Description of the Related Art

In response to an increase in transmission capacity and transmission speed of electronic devices such as mobile phones, notebook computers, printers and the like, a combined optical and electrical flexible wiring using an optical wiring in an internal wiring portion has been suggested.

The combined optical and electrical flexible wiring is constructed such that an optical waveguide (optical wiring) such as an optical fiber and an optical-electrical conversion component for conducting the interconversion between an optical signal and an electrical signal are mounted on a flexible printed circuit (FPC) with a wiring pattern formed on the surface of a film substrate (refer to JP-A-2010-19895 and JP-A-2008-158539, for example).

Thus, the combined optical and electrical flexible wiring (FPC type combined optical and electrical flexible wiring) can transmit a large capacity of information at high speed and with low noise.

Refer to JP-A-2010-19895 and JP-A-2008-158539, for example.

SUMMARY OF THE INVENTION

Now, a flexible flat cable (FFC) with a plurality of conductors (straight conductors) aligned parallel on a long film substrate surface is used for connection between a control unit of a printer and a head of that printer, for example. In recent years, due to the increases in the transmission capacity and transmission speed for processing, there have been increases in transmission capacity and transmission speed of the FFC as well.

In view of such circumstances, there is considered an FFC type combined optical and electrical flexible wiring, in which, as with the FPC, the FFC is mounted with an optical wiring such as an optical fiber and an optical-electrical conversion component, to thereby conduct the interconversion between an optical signal and an electrical signal.

Unlike the previously described FPC of the FPC type combined optical and electrical flexible wiring, however, the FFC cannot, for its production method reason, be formed with a wiring pattern, which extends (bends) in its width direction.

For that, when with the plural conductors (straight conductors) and the optical fiber arranged on the FFC, the plural conductors and the optical fiber are connected to the optical-electrical conversion component, the plural conductors and the optical fiber interfere with each other. Due to this, no FFC type combined optical and electrical flexible wiring with the FFC and the optical wiring combined together therein has yet been suggested.

Accordingly, it is an object of the present invention to provide a combined optical and electrical flexible wiring having an optical wiring combined with an FFC, and a production method therefor.

(1) According to one embodiment of the invention, a combined optical and electrical flexible wiring comprises:
  a first film substrate;
  a plurality of conductors aligned parallel on a surface of the first film substrate;
  an optical fiber provided on the surface of the first film substrate and aligned parallel to the plural conductors;
  a second film substrate with which the plural conductors and the optical fiber are covered in such a manner as to include an exposed portion in which the plural conductors and the optical fiber aligned parallel on the first film substrate are partially exposed;
  a resin mount provided over the exposed portion in such a manner as to cover the plural conductors and the optical fiber, the resin mount being formed with a light inlet or outlet groove including a mirror surface therein;
  an optical-electrical conversion component formed on a surface of the resin mount, to conduct an interconversion between an electrical signal transmitted through the conductors and an optical signal transmitted through the optical fiber, while being optically connected with the optical fiber via the mirror surface of the light inlet or outlet groove; and
  a wiring pattern formed on the surface of the resin mount, to electrically connect the optical-electrical conversion component and the conductors.

(2) According to another embodiment of the invention, a combined optical and electrical flexible wiring producing method comprises:
  preparing a flexible flat cable with a plurality of conductors aligned parallel on a surface of a first film substrate;
  aligning an optical fiber parallel to the plural conductors on the surface of the first film substrate;
  covering the optical fiber and the plural conductors with a second film substrate in such a manner that a portion of the optical fiber and respective portions of the plural conductors are exposed in a predetermined range;
  forming a light inlet or outlet surface in the exposed portion of the optical fiber;
  forming a resin mount to cover the exposed portions of the plural conductors and the exposed portion of the optical fiber, and forming a light inlet or outlet groove in that resin mount;
  forming one surface of the light inlet or outlet groove into a mirror surface to bend an optical axis of the optical fiber;
  forming a wiring pattern on a surface of the resin mount;
  mounting an optical-electrical conversion component for conducting an interconversion between an optical signal and an electrical signal, on the surface of the resin mount and across the light inlet or outlet groove in such a manner that the optical-electrical conversion component faces the mirror surface; and
  electrically connecting the optical-electrical conversion component and the conductors via the wiring pattern.

In the above embodiment (2) of the invention, the following modifications and changes can be made.

(i) The combined optical and electrical flexible wiring producing method further comprises
  after forming the mirror surface, filling the light inlet or outlet groove with a light transmissive resin, and subsequently forming the wiring pattern on a surface of that light transmissive resin.

(ii) The combined optical and electrical flexible wiring producing method further comprises:

mounting the optical-electrical conversion components at both ends respectively of the flexible flat cable mounted with the optical fiber;

electrically connecting the optical-electrical conversion components at one end and the other end to the same conductors respectively; and partially punching the same conductors so as not to electrically short both the optical-electrical conversion components.

(iii) The wiring pattern is formed to extend over the surface of the first film substrate, and configured as a contact pad of a connector which is electrically connected with an electronic device.

(iv) Side surfaces of the resin mount across the surface of the first film substrate are formed to be inclined, and the inclined side surfaces are formed with the wiring pattern.

(v) The combined optical and electrical flexible wiring producing method further comprises laminating with a reinforcing plate a reverse surface of the first film substrate at a position to be mounted with the optical-electrical conversion component.

(vi) The light inlet or outlet surface of the exposed portion of the optical fiber is formed by positioning a lower surface of a core of the optical fiber to be higher than an upper surface of the conductors, and dicing until having cut the core of the optical fiber, so that the optical fiber is cut, but the conductors are not cut.

Points of the Invention

According to one embodiment of the invention, a combined optical and electrical flexible wiring is constructed such that a resin mount is formed to cover a conductor and an optical fiber exposed from a film substrate at a position to be mounted with an optical-electrical conversion component, and a desired wiring pattern is formed on the surface of the resin mount. Thereby, even on a linearly wired FFC (=flexible flat cable), the optical-electrical conversion component can be mounted. As a result, the FFC can be high in speed, large in capacity, and low in noise.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Below is described a preferred embodiment according to the invention in conjunction with the accompanying drawings.

Figure 1A:
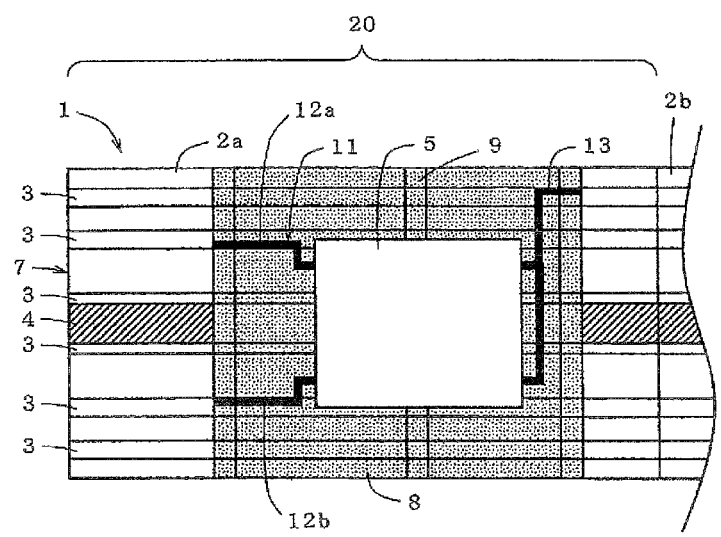
FIGS. 1A and 1B are a top view and a side view, respectively, showing a combined optical and electrical flexible wiring according to the invention.
Figure 1B:
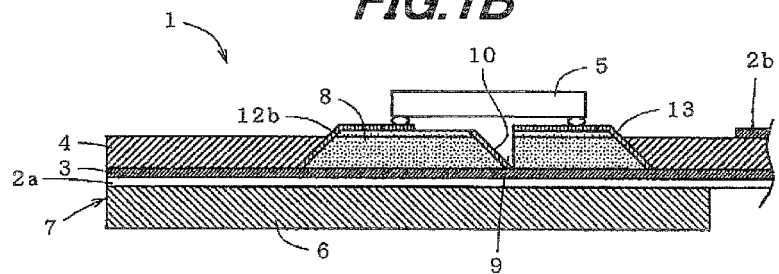

Combined Optical and Electrical Flexible Wiring 1 Structure and Producing Method FIGS. 1A and 1B are a top view and a side view, respectively, showing a combined optical and electrical flexible wiring (FFC type combined optical and electrical flexible wiring) 1 in this embodiment.

As shown in FIGS. 1A and 1B, the combined optical and electrical flexible wiring 1 in this embodiment is that mounted with an optical fiber 4 for transmitting a large capacity of information at high speed, and an optical-electrical conversion component 5 for conducting the interconversion between an optical signal and an electrical signal, on a flexible flat cable (FFC) with a plurality of (in FIG. 1A, six) conductors 3 (plurality of straight conductors 3) aligned parallel on a long film substrate 2a surface.

This combined optical and electrical flexible wiring 1 structure is described in conjunction with its producing method.

Figure 2A:
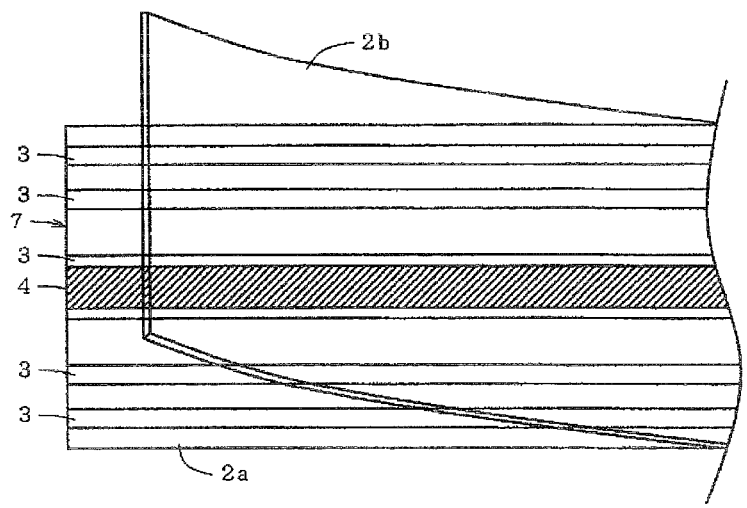
FIGS. 2A and 2B are a top view and a side view, respectively, showing one step of a producing method for the combined optical and electrical flexible wiring according to the invention.
Figure 2B:
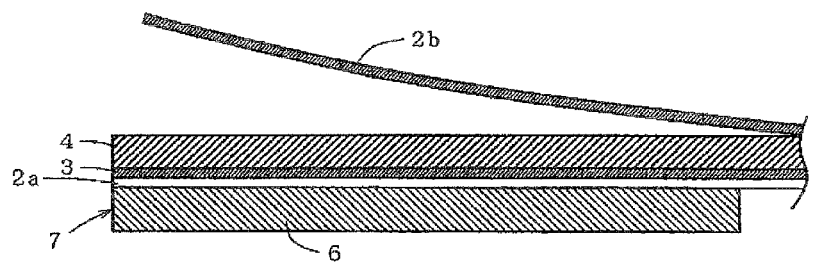

Referring to FIGS. 2A and 2B, the plural conductors 3 are first aligned parallel on the film substrate (first film substrate) 2a surface, and the optical fiber 4 is disposed parallel to the conductors 3, and further the plural conductors 3 and the optical fiber 4 are laminated with a film substrate (second film substrate) 2b thereover, so that the plural conductors 3 and the optical fiber 4 are held between the film substrates 2a and 2b. This results in the FFC having the optical fiber 4 aligned parallel to the plural conductors 3.

The film substrate 2a and 2b surfaces to be laminated are formed with adhesive layers respectively, so that the parallel positions of the plural conductors 3 and the optical fiber 4 are fixed by being held between the film substrates 2a and 2b. Another method to fix the parallel positions of the plural conductors 3 and the optical fiber 4 may be used: The parallel positions of the plural conductors 3 and the optical fiber 4 may be fixed by forming grooves in the film substrate 2a and disposing the plural conductors 3 and the optical fiber 4 in those grooves respectively. Incidentally, in this embodiment, the plural conductors 3 and the optical fiber 4 are formed in such a manner that the optical fiber 4 is thicker in the side view as shown in FIG. 1B, than the plural conductors 3.

The reverse surface of a film substrate 2a portion (in FIG. 2B, an FFC end) to be mounted with the optical-electrical conversion component 5 is then laminated with a reinforcing plate 6, and the film substrate 2b portion at that film substrate 2a portion is removed, for example by being peeled. By being laminated with the reinforcing plate 6, that film substrate 2a portion is no longer flexible, but the positional relationships between the members are fixed and are not likely to be misaligned. This therefore facilitates the subsequent processing. In this embodiment, in order for the FFC end laminated with the reinforcing plate 6 to be used for a card edge connector 7, the reinforcing plate 6 has been provided from substantially directly below the optical-electrical conversion component 5 to the FFC end face. Incidentally, although in this embodiment the exposed portion 20 in which the plural conductors 3 and the optical fiber 4 aligned parallel on the film substrate 2a are partially exposed has been formed by peeling and removing the film substrate 2b, another method to form the exposed portion 20 may be used: The exposed portion 20 may be formed, for example by lamination with the film substrate 2b shifted relative to the film substrate 2a.

Figure 3A:
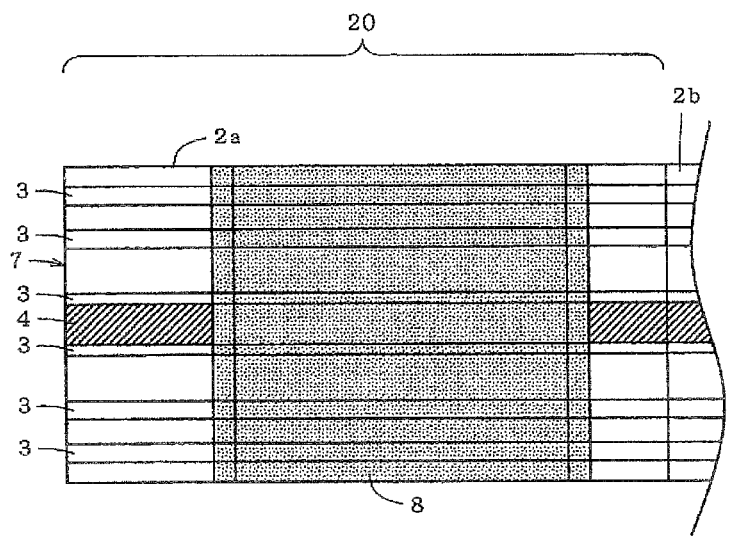
FIGS. 3A and 3B are a top view and a side view, respectively, showing one step of the producing method for the combined optical and electrical flexible wiring according to the invention.
Figure 3B:
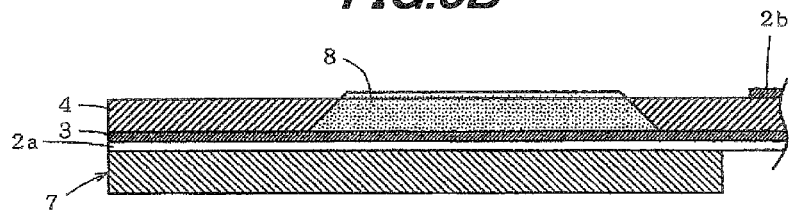

Referring to FIGS. 3A and 3B, at a position to be mounted with the optical-electrical conversion component 5 on the film substrate 2a surface, there is subsequently formed a resin mount 8 for covering the conductor 3 and optical fiber 4 portions exposed from the film substrate 2b.

This resin mount 8 is formed by means of a mold using a thermoplastic resin, a light curable resin or the like. For use of the light curable resin, the mold to be used therefor may be formed of a light transmissive material (e.g. glass).

The resin mount 8 is formed with gently inclined side surfaces at both its ends (in FIG. 3B, right and left side surfaces), to thereby facilitate wiring pattern formation, as described later.

Figure 4A:
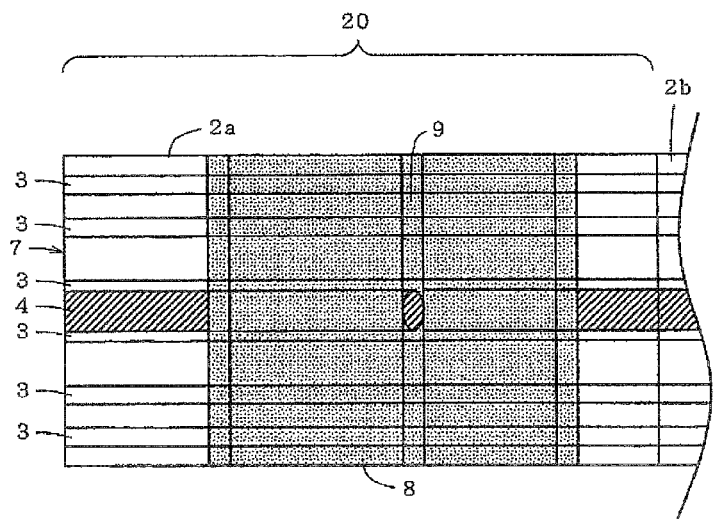
FIGS. 4A and 4B are a top view and a side view, respectively, showing one step of the producing method for the combined optical and electrical flexible wiring according to the invention.
Figure 4B:
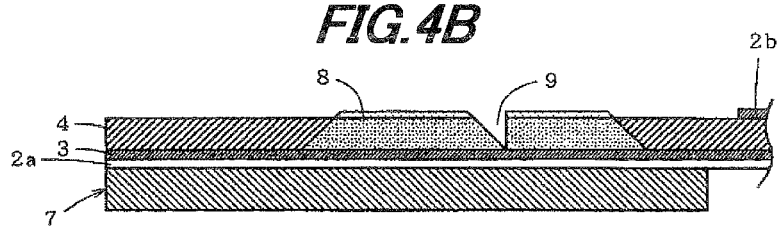

Referring to FIGS. 4A and 4B, the resin mount 8 formation is followed by dicing the resin mount 8 together with the optical fiber 4 to form a light inlet or outlet groove 9. It is preferable that this light inlet or outlet groove 9 be formed to have as small a width (in FIG. 4B, width formed by an inclined surface and a vertical surface) as possible, and moreover that the inclined surface (later-described mirror surface 10) and the vertical surface (light inlet or outlet surface of the optical fiber 4) be so adjacent as to contact each other, as shown in FIG. 1B. This is because the smaller this width formed, the smaller the loss of light without widening in this light inlet or outlet groove 9. In this case, it is preferable that the dicing be performed until reaching the upper surface of the conductors 3, an as not to cut the conductors 3 of the FFC. Incidentally, in case the conductors 3 are cut, the cut portion of the conductors 3 is also electrically connected by use of a conductive ink or the like.

Also, the dicing is performed by use of a blade having an inclined surface. This results in the light inlet or outlet groove 9 having at the FFC end one inclined surface (to be formed with a later-described mirror surface 10) at a predetermined angle (e.g. 45 degrees) to an optical axis of the optical fiber 4.

Incidentally, because the dicing is performed in order to form the light inlet or outlet groove 9 for letting out light of the optical fiber 4 or letting in light of the optical-electrical conversion component 5, the dicing may be performed until having cut at least the core of the optical fiber 4, but the lower cladding shown of the optical fiber 4 may be left. Also, because a portion at the FFC end (in FIGS. 1A and 1B, at the left side) of the optical fiber 4 is not used, this optical fiber 4 portion at the FFC end may be removed during the dicing. This allows the card edge connector 7 of the combined optical and electrical flexible wiring 1 to be the same in configuration as conventional FFC card edge connectors.

Also, in order to cut the optical fiber 4, but not the conductors 3 during the dicing, the outside diameter and the core size of the optical fiber 4 and the thickness of the conductors 3 may be configured so that the lower surface of the core of the optical fiber 4 is positioned to be higher than the upper surface of the conductors 3. This allows the conductors 3 to be not cut by the dicing being performed until having cut the core of the optical fiber 4.

Figure 5A:
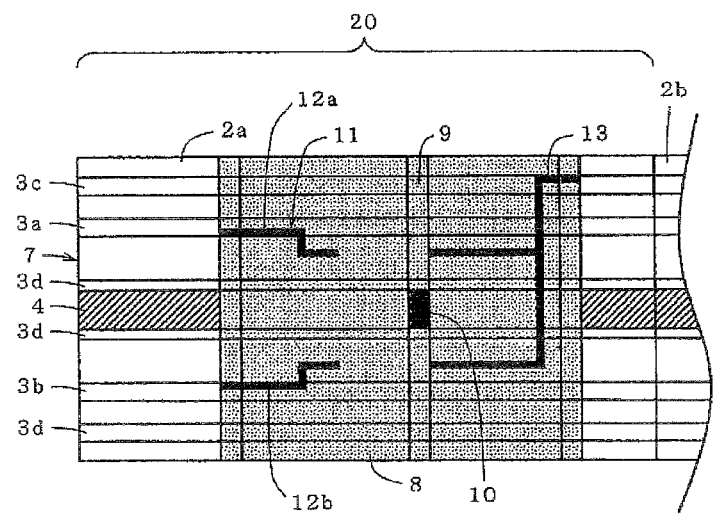
FIGS. 5A and 5B are a top view and a side view, respectively, showing one step of the producing method for the combined optical and electrical flexible wiring according to the invention.
Figure 5B:
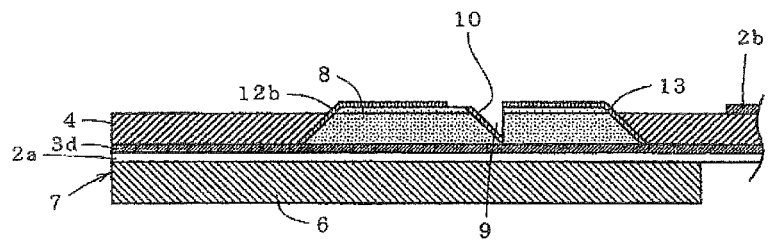

Referring to FIGS. 5A and 5B, the inclined surface of the light inlet or outlet groove 9 is then formed with a mirror surface 10 for bending the optical axis of the optical fiber 4 (in other words, for optically connecting the optical fiber 4 and the optical-electrical conversion component 5), while the resin mount 8 surface is formed with a wiring pattern 11 to be mounted with the optical-electrical conversion component 5 and electrically connect the optical-electrical conversion component 5.

The mirror surface 10 may be formed at a position facing at least the light inlet or outlet surface (formed in the previous dicing step) of the optical fiber 4, but is not required to be formed over the entire inclined surface of the light inlet or outlet groove 9. Also, it is preferable that the mirror surface 10 be formed by providing a metal film having a high reflectance, so as to enhance the efficiency of letting out light, or also reduce the loss during letting in light.

The wiring pattern 11 is formed by printing. A method therefor is to blast nanopowder by means of inkjet printing, or to print a screen paste (conductive paste) by means of screen printing.

For the wiring pattern 11, there are formed signal wirings 12 (transmitting wiring 12a, receiving wiring 12b) and a ground wiring (common ground wiring) 13. The signal wirings 12a and 12b are electrically connected to different conductors 3a and 3b respectively, while the ground wiring 13 is electrically connected to a common ground conductor 3c. Incidentally, the other conductors 3d are used for control signals, power supply or the like.

Referring again to FIGS. 1A and 1B, the resin mount 8 surface is finally mounted with the optical-electrical conversion component 5 across the light inlet or outlet groove 9 in such a manner that a light inlet or outlet surface of the optical-electrical conversion component 5 faces the mirror surface 10, and in such a manner that the optical-electrical conversion component 5 is electrically connected with the predetermined wiring pattern 11. This results in the combined optical and electrical flexible wiring 1. The optical-electrical conversion component 5 is configured as including optical elements (a light receiving element, alight emitting element, etc.), a driver IC for driving the light emitting element, an amplifier IC for amplifying output of the light receiving element, etc. The optical-electrical conversion component 5 is for receiving an electrical signal through the card edge connector 7 transmitted from an electronic device, converting it into an optical signal, and passing that optical signal into the optical fiber 4, or also for receiving an optical signal passed from the optical fiber 4, converting it into an electrical signal, and transmitting that electrical signal through the card edge connector 7.

Advantages of the Embodiment

In this manner, the combined optical and electrical flexible wiring 1 is configured as allowing the resin mount 8 surface to be formed with the desired wiring pattern 11. Even the linearly wired FFC can therefore be mounted with the optical-electrical conversion component 5, and the FFC can be high in speed, large in capacity, and low in noise.

Further, the end of the combined optical and electrical flexible wiring 1 is shaped into the card edge connector 7 which is the same in configuration as conventional FFC card edge connectors through which only electrical signals are transmitted. The combined optical and electrical flexible wiring 1 can therefore directly be installed and used in traditional electronic devices, without the need to make a new electronic device. This is economical.

Modifications

The invention is not limited to the above embodiment, but various modifications or alterations may be made without departing from the spirit and scope of the invention.

Figure 6A:
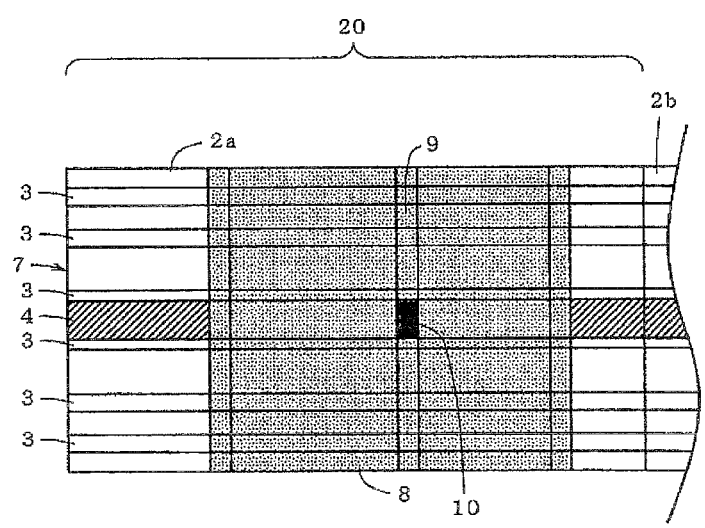
FIGS. 6A and 6B are a top view and a side view, respectively, showing one step of the producing method for a combined optical and electrical flexible wiring in one modification according to the invention.
Figure 6B:
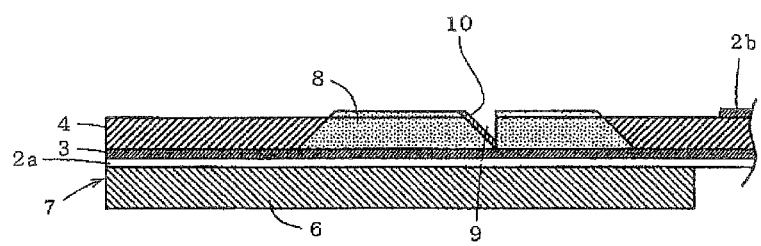
Figure 7A:
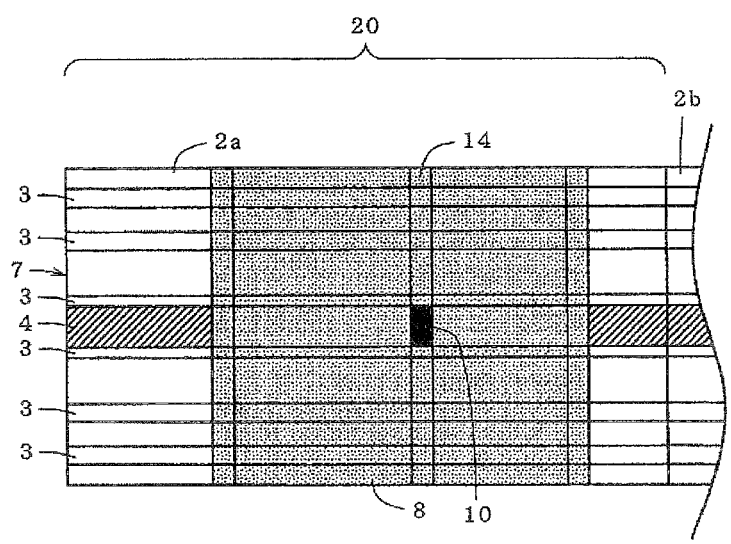
FIGS. 7A and 7B are a top view and a side view, respectively, showing one step of the producing method for the combined optical and electrical flexible wiring in the modification according to the invention.
Figure 7B:
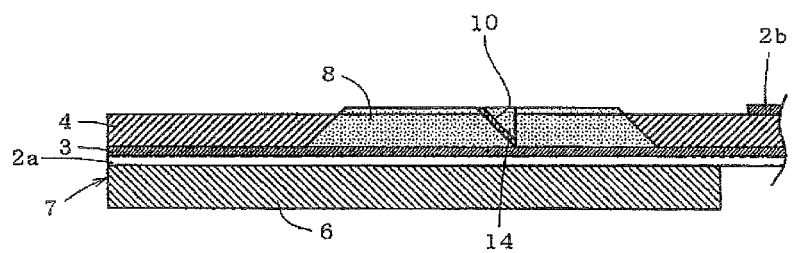
Figure 8A:
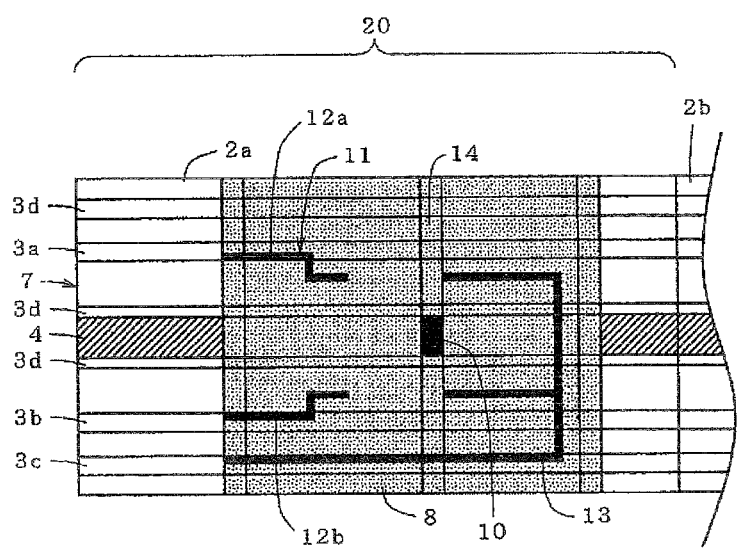
FIGS. 8A and 8B are a top view and a side view, respectively, showing one step of the producing method for the combined optical and electrical flexible wiring in the modification according to the invention.
Figure 8B:
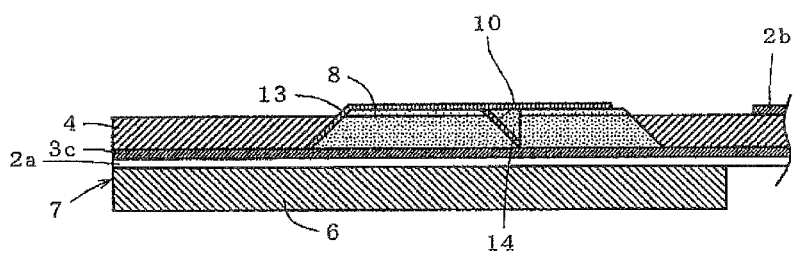

For example, although in this embodiment the mirror surface 10 and the wiring pattern 11 have been formed concurrently, the mirror surface 10 may first be formed as shown in FIGS. 6A and 6B, and subsequently the light inlet or outlet groove 9 may be filled with a light transmissive resin 14 as shown in FIGS. 7A and 7B, and thereafter the wiring pattern 11 may also be formed on the surface of the light transmissive resin 14 as shown in FIGS. 8A and 8B. This configuration allows the wiring pattern 11 to be formed across the light inlet or outlet groove 9. The degree of freedom of wiring is therefore enhanced. That is, it is possible to mount more various elements.

Figure 9:
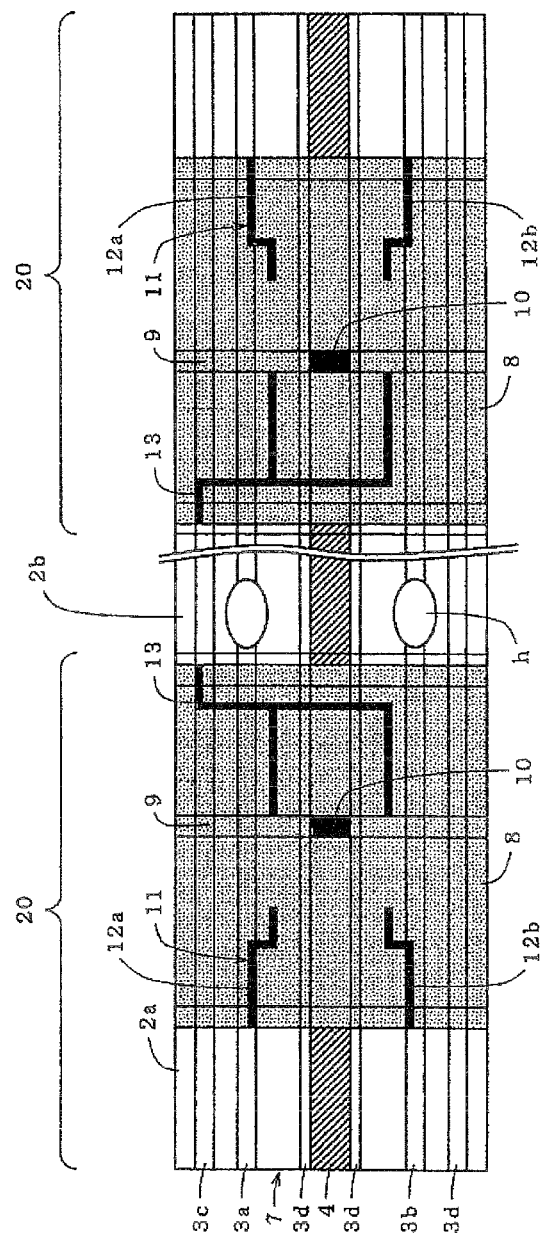
FIG. 9 is a top view showing a combined optical and electrical flexible wiring in another modification to the invention.

Referring also to FIG. 9, a combined optical and electrical flexible harness is configured as being mounted with the optical-electrical conversion components 5 at both ends respectively of the FFC mounted with the optical fiber 4. In this case, punch holes h may be formed by partially punching the film substrate 2a (and the film substrate 2b) and the same conductors 3a and 3b electrically connected with both the optical-electrical conversion components 5 respectively, so as not to electrically short the optical-electrical conversion components 5 at one end and the other end. This configuration allows one conductor 3a and 3b to be used as a separate wiring at both the ends of the FFC. The number of the conductors 3 mounted in the FFC can therefore be reduced. This allows low cost and small transverse width (in FIG. 9, vertical width) of the FFC. It is therefore possible to contribute to low cost and small size of electronic devices.

Incidentally, both the optical-electrical conversion components 5 may be provided after the punch hole h formation.

Figure 10:
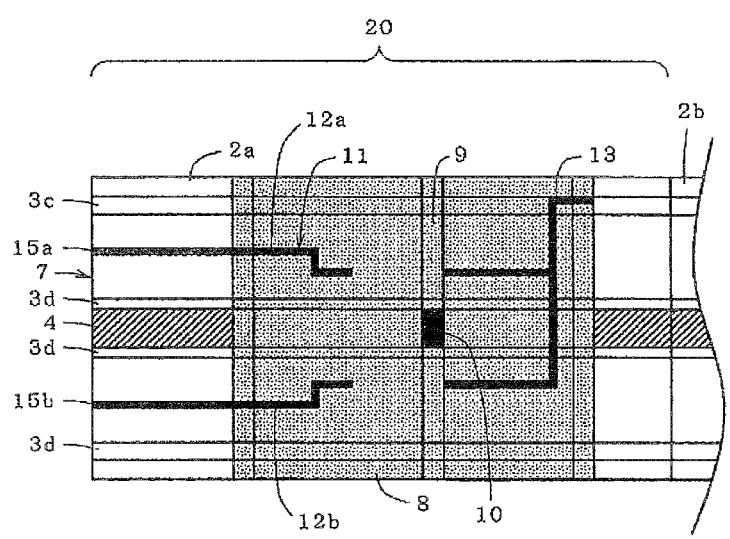
FIG. 10 is a top view showing the combined optical and electrical flexible wiring in another modification to the invention.

Also, although in this embodiment the wiring pattern 11 (i.e. the signal wirings 12a and 12b) has been electrically connected to the conductors 3a and 3b of the FFC so that the FFC end is configured as the card edge connector 7, the wiring pattern 11 (i.e. the signal wirings 12a and 12b) may, as shown in FIG. 10, be formed to extend over the film substrate 2a surface, and configured as contact pads 15a and 15b of the card edge connector 7.

Also, although in this embodiment the optical fiber 4 serving as the optical wiring and the optical-electrical conversion component 5 have been provided as being configured as only one pair, there may be provided a plurality of pairs thereof.

A combined optical and electrical flexible wiring in a modification to the invention will be described below.

The combined optical and electrical flexible wiring in the modification to the invention differs from the previously described combined optical and electrical flexible wiring 1 in that the optical fiber 4 is diced prior to forming the resin mount 8.

Figure 11A:
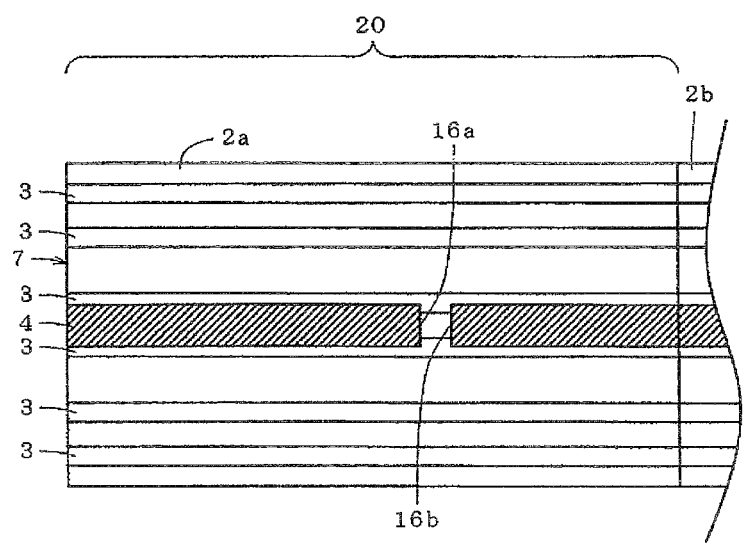
FIGS. 11A and 11B are a top view and a side view, respectively, showing one step of the producing method for the combined optical and electrical flexible wiring in another modification to the invention.
Figure 11B:
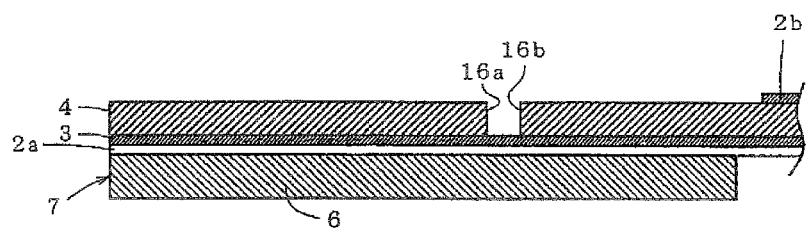

Referring to FIGS. 11A and 11B, specifically, the removal of the film substrate 2b is followed by dicing the optical fiber 4 to form facing light inlet or outlet surfaces 16a and 16b therein.

Figure 12A:
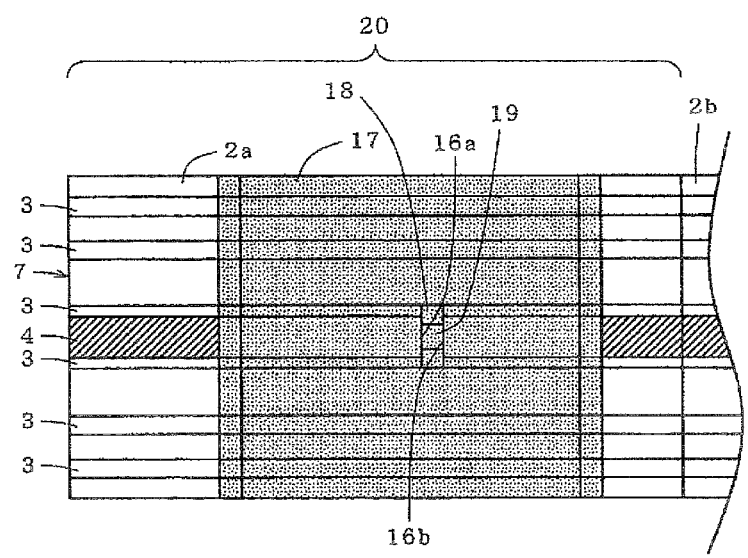
FIGS. 12A and 12B are a top view and a side view, respectively, showing one step of the producing method for the combined optical and electrical flexible wiring in the modification to the invention.
Figure 12B:
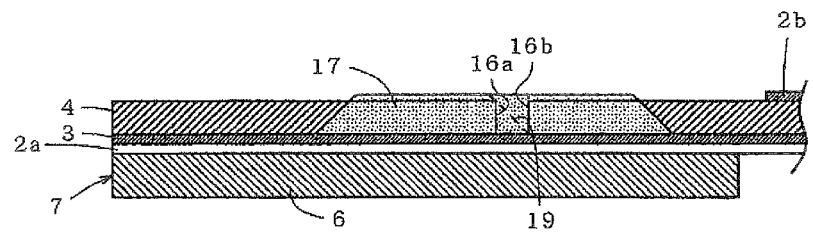

Referring to FIGS. 12A and 12B, this is followed by forming a resin mount 17, which covers the conductors 3 and the optical fiber 4 around the facing light inlet or outlet surfaces 16a and 16b, and forming a hole-like light inlet or outlet groove 18 in that resin mount 17. In this case, one surface of the light inlet or outlet groove 18 facing the light inlet or outlet surface 16b is formed to be inclined at 45 degrees to the optical axis of the optical fiber 4 (i.e. is formed to optically connect the optical fiber 4 and the optical-electrical conversion component 5), to form an inclined surface 19.

Figure 13A:
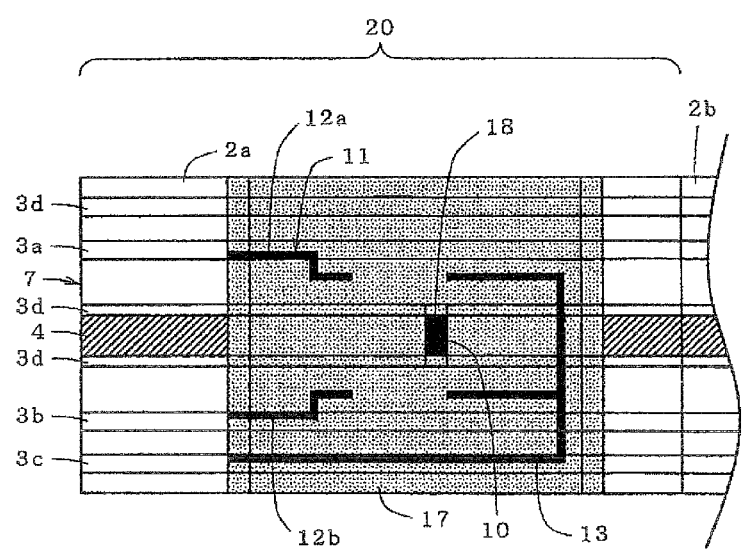
FIGS. 13A and 13B are a top view and a side view, respectively, showing one step of the producing method for the combined optical and electrical flexible wiring in the modification to the invention.
Figure 13B:
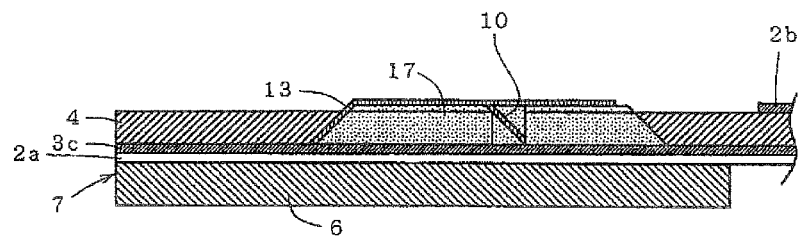

Referring to FIGS. 13A and 13B, the inclined surface 19 of the light inlet or outlet groove 18 is then formed with a mirror surface 10 for bending the optical axis of the optical fiber 4, while the resin mount 17 surface is formed with a wiring pattern 11 to be mounted with the optical-electrical conversion component 5. The resin mount 17 surface positioned above the light inlet or outlet groove 18 is then mounted with the optical-electrical conversion component 5 in such a manner that the light inlet or outlet surface of the optical-electrical conversion component 5 faces the mirror surface 10, while the optical-electrical conversion component 5 and the wiring pattern 11 are electrically connected together.

In this manner, the combined optical and electrical flexible wiring may be configured to enhance the degree of freedom of wiring of the wiring pattern 11 while lessening the number of steps, more than when filling the light inlet or outlet groove 9 with the light transmissive resin 14 is followed by the wiring pattern 11 formation.

Also, this combined optical and electrical flexible wiring may be altered variously, as described above.

In other words, the invention can provide the combined optical and electrical flexible wiring having the optical wiring combined with the FFC.

Although the invention has been described with respect to the above embodiments, the above embodiments are not intended to limit the appended claims. Also, it should be noted that not all the combinations of the features described in the above embodiments are essential to the means for solving the problems of the invention.

What is claimed is:

1. A combined optical and electrical flexible wiring, comprising:
   a first film substrate;
   a plurality of conductors aligned parallel on a surface of the first film substrate;
   an optical fiber provided on the surface of the first film substrate and aligned parallel to the plural conductors;
   a second film substrate with which the plural conductors and the optical fiber are covered in such a manner as to include an exposed portion in which the plural conductors and the optical fiber aligned parallel on the first film substrate are partially exposed;
   a resin mount provided over the exposed portion in such a manner as to cover the plural conductors and the optical fiber, the resin mount being formed with a light inlet or outlet groove including a mirror surface therein;

an optical-electrical conversion component formed on a surface of the resin mount, to conduct an interconversion between an electrical signal transmitted through the conductors and an optical signal transmitted through the optical fiber, while being optically connected with the optical fiber via the minor surface of the light inlet or outlet groove; and a wiring pattern formed on the surface of the resin mount, to electrically connect the optical-electrical conversion component and the conductors.

2. A combined optical and electrical flexible wiring producing method, comprising:

preparing a flexible flat cable with a plurality of conductors aligned parallel on a surface of a first film substrate;

aligning an optical fiber parallel to the plural conductors on the surface of the first film substrate;

covering the optical fiber and the plural conductors with a second film substrate in such a manner that a portion of the optical fiber and respective portions of the plural conductors are exposed in a predetermined range;

forming a light inlet or outlet surface in the exposed portion of the optical fiber;

forming a resin mount to cover the exposed portions of the plural conductors and the exposed portion of the optical fiber, and forming a light inlet or outlet groove in that resin mount;

forming one surface of the light inlet or outlet groove into a minor surface to bend an optical axis of the optical fiber;

forming a wiring pattern on a surface of the resin mount;

mounting an optical-electrical conversion component for conducting an interconversion between an optical signal and an electrical signal, on the surface of the resin mount and across the light inlet or outlet groove in such a manner that the optical-electrical conversion component faces the mirror surface; and electrically connecting the optical-electrical conversion component and the conductors via the wiring pattern.

3. The combined optical and electrical flexible wiring producing method according to claim 2, further comprising after forming the mirror surface, filling the light inlet or outlet groove with a light transmissive resin, and subsequently forming the wiring pattern on a surface of that light transmissive resin.

4. The combined optical and electrical flexible wiring producing method according to claim 2, further comprising:

mounting the optical-electrical conversion components at both ends respectively of the flexible flat cable mounted with the optical fiber;

electrically connecting the optical-electrical conversion components at one end and the other end to the same conductors respectively; and partially punching the same conductors so as not to electrically short both the optical-electrical conversion components.

5. The combined optical and electrical flexible wiring producing method according to claim 2, wherein the wiring pattern is formed to extend over the surface of the first film substrate, and configured as a contact pad of a connector which is electrically connected with an electronic device.

6. The combined optical and electrical flexible wiring producing method according to claim 2, wherein side surfaces of the resin mount across the surface of the first film substrate are formed to be inclined, and the inclined side surfaces are formed with the wiring pattern.

7. The combined optical and electrical flexible wiring producing method according to claim 2, further comprising laminating with a reinforcing plate a reverse surface of the first film substrate at a position to be mounted with the optical-electrical conversion component.

8. The combined optical and electrical flexible wiring producing method according to claim 2, wherein the light inlet or outlet surface of the exposed portion of the optical fiber is formed by positioning a lower surface of a core of the optical fiber to be higher than an upper surface of the conductors, and dicing until having cut the core of the optical fiber, so that the optical fiber is cut, but the conductors are not cut.

9. The combined optical and electrical flexible wiring, according to claim 1, wherein the resin mount is provided over the surface of the first film substrate and comprises an inclined side surface comprising the wiring pattern.

10. The combined optical and electrical flexible wiring, according to claim 1, wherein the wiring pattern extends over the surface of the first film substrate and the wiring pattern constitutes a contact pad of a connector to be electrically connected to an electronic device.

11. The combined optical and electrical flexible wiring, according to claim 1, wherein a reverse surface of the first film substrate is laminated with a reinforcing plate at a position corresponding to a mount position of the optical-electrical conversion component.

12. The combined optical and electrical flexible wiring, according to claim 1, wherein the light inlet or outlet groove is filled with a light transmissive resin, and the wiring pattern is provided on a surface of the light transmissive resin.

* * * * *